(12) United States Patent
Seebacher et al.

(10) Patent No.: US 10,958,224 B2
(45) Date of Patent: *Mar. 23, 2021

(54) METHOD AND DEVICE FOR PROVIDING A BIAS VOLTAGE IN TRANSCEIVERS OPERATING IN TIME DIVISION MULTIPLEXING OPERATION

(71) Applicant: Infineon Technologies AG, Neubiberg (DE)

(72) Inventors: David Seebacher, Villach (AT); Pantelis Sarais, Villach (AT); Peter Singerl, Villach (AT); Herwig Wappis, Drobollach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/903,011

(22) Filed: Jun. 16, 2020

(65) Prior Publication Data

US 2020/0313635 A1 Oct. 1, 2020

Related U.S. Application Data

(63) Continuation of application No. 16/106,796, filed on Aug. 21, 2018, now Pat. No. 10,727,793.

(30) Foreign Application Priority Data

Aug. 21, 2017 (DE) .......................... 102017119054.6

(51) Int. Cl.
*H04B 1/00* (2006.01)
*H03F 3/24* (2006.01)
*H03F 1/02* (2006.01)
*H04B 1/401* (2015.01)
*H03F 3/193* (2006.01)
*H03F 3/19* (2006.01)
*H03F 3/45* (2006.01)

(Continued)

(52) U.S. Cl.
CPC ........... *H03F 3/245* (2013.01); *H03F 1/0272* (2013.01); *H03F 3/19* (2013.01); *H03F 3/193* (2013.01); *H03F 3/45475* (2013.01); *H04B 1/38* (2013.01); *H04B 1/401* (2013.01); *H04J 3/02* (2013.01); *H03F 2200/108* (2013.01); *H03F 2200/18* (2013.01); *H03F 2200/451* (2013.01); *H03F 2200/481* (2013.01); *H03F 2203/45594* (2013.01)

(58) Field of Classification Search
CPC ... H04B 1/38; H04B 1/401; H04J 3/02; H03F 1/0272; H03F 2200/18; H03F 3/19; H03F 3/193; H03F 3/245; H03F 3/45475
See application file for complete search history.

(56) References Cited

U.S. PATENT DOCUMENTS 5,752,171 A 5/1998 Akiya
8,009,785 B2 * 8/2011 Au ........................... H04B 1/40
375/371

(Continued)

*Primary Examiner* — Nhan T Le
(74) *Attorney, Agent, or Firm* — Murphy, Bilak & Homiller, PLLC

(57) ABSTRACT

Devices and methods for generating a bias voltage for a transceiver operating in time division multiplexing operation, and corresponding transceivers are provided. In this case, the bias voltage is controlled in guard intervals between transmission and reception of signals by the transceiver.

17 Claims, 9 Drawing Sheets

(51) Int. Cl.
*H04B 1/38* (2015.01)
*H04J 3/02* (2006.01)

(56) References Cited

U.S. PATENT DOCUMENTS

| | | | | |
|---|---|---|---|---|
| 8,036,619 | B2 * | 10/2011 | Heinonen | H03B 5/1203 |
| | | | | 455/255 |
| 8,145,060 | B2 * | 3/2012 | Hufstedler | H04B 10/6911 |
| | | | | 398/136 |
| 10,727,793 | B2 * | 7/2020 | Seebacher | H03F 3/193 |
| 2011/0124293 | A1 | 5/2011 | Kasai | |
| 2014/0098908 | A1 | 4/2014 | Rangachari et al. | |
| 2014/0103902 | A1 | 4/2014 | Otremba et al. | |
| 2015/0035605 | A1 | 2/2015 | Lam | |

\* cited by examiner

METHOD AND DEVICE FOR PROVIDING A BIAS VOLTAGE IN TRANSCEIVERS OPERATING IN TIME DIVISION MULTIPLEXING OPERATION

TECHNICAL FIELD

The present application relates to methods and devices for providing a bias voltage in transceivers, and corresponding transceivers.

BACKGROUND

In transceivers, a bias voltage is required for biasing transistors, in particular for radio-frequency (RF) power amplifiers. With a bias voltage of this type, it is possible for example to set an operating point of transistors of the power amplifier in order to ensure a good linearity of the power amplifier. This can contribute to increasing a data throughput in a communication channel.

One aim here is for a drain current of a radio-frequency power amplifier, if no radio-frequency signal is present (also referred to quiescent drain current), to be kept constant as far as possible, which ensures that the power amplifier operates with desired properties.

However, since various system parameters vary during the lifetime of a transceiver, in particular of a power amplifier (for example a temperature at which the amplifier operates, or changes on account of a drift of components of the amplifier), adaptive biasing is desirable in order as far as possible to ensure the desired properties of the amplifier even in the event of such changes in system parameters.

During transmission operation of the power amplifier of a transceiver, at an input of a transistor biased with the bias voltage there is not just the bias voltage present, rather a radio-frequency signal to be transmitted is superposed on said bias voltage. Therefore, in this state it is difficult to measure the drain quiescent current (i.e. the drain current of the transistor on account of the bias voltage without a radio-frequency signal present) and to control the bias voltage on the basis of the measurement. In conventional transceivers, however, the power amplifier is normally in operation, and so essentially a setting or control of the bias voltage can take place only infrequently, for example upon start-up of the power amplifier. Control of the bias voltage in the course of operation of the transceiver would be desirable on the other hand, however, in order to be able to continuously ensure the desired properties of the transceiver, for example of a power amplifier thereof.

It is an object of the present application to provide corresponding methods for providing a bias voltage, devices for providing a bias voltage, and corresponding transceivers, in which this problem is eliminated or at least alleviated.

SUMMARY

In accordance with one exemplary embodiment, a device for generating a bias voltage for a transceiver operating in time division multiplexing operation is provided, comprising: a bias voltage control loop for controlling the bias voltage; and a loop controller, configured to deactivate the bias voltage control loop during transmission and reception of signals by the transceiver and to activate said bias voltage control loop at least in a portion of at least some guard intervals between transmission and reception of signals of the transceiver.

In accordance with another exemplary embodiment, a method for generating a bias voltage for a transceiver operating in a time division duplexing method is provided, comprising: activating a bias voltage control in at least one portion of some guard intervals between transmission and reception of signals by the transceiver; deactivating the bias voltage control upon transmission and reception of signals; and controlling the bias voltage if the bias voltage control is activated.

The brief summary above is only an overview of some possible exemplary embodiments and should not be interpreted as restrictive. In particular, other exemplary embodiments can have features other than those mentioned above.

DETAILED DESCRIPTION

Figure 1:
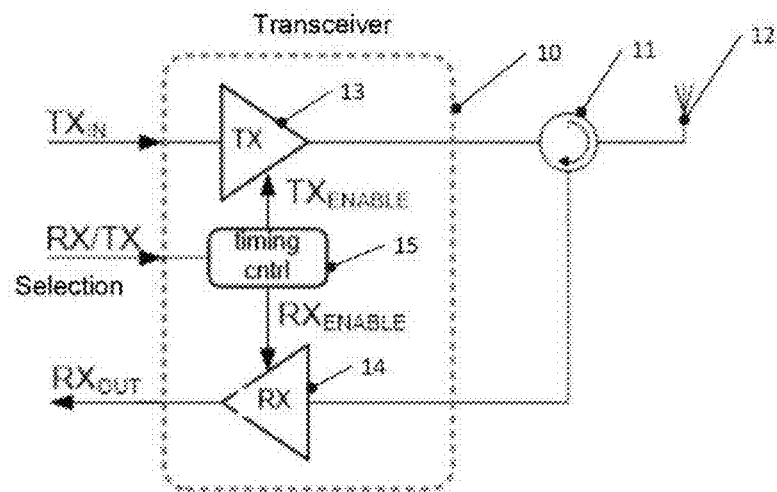
FIG. 1 is a schematic diagram of a transceiver in accordance with one exemplary embodiment.

The invention is explained in greater detail below on the basis of various exemplary embodiments. It should be taken into consideration that these exemplary embodiments serve only for illustration and should not be interpreted as restrictive. In this regard, a description of an exemplary embodiment having a multiplicity of features should not be interpreted to the effect that all these features are necessary for the implementation. Rather, in other exemplary embodiments, some of the elements or components presented can be omitted and/or alternative elements or components can be provided. Furthermore, in addition to the elements or components explicitly presented, further elements or components, for example components or elements used in conventional transceivers and/or power amplifiers, can be provided.

Components or elements of different exemplary embodiments can be combined with one another in other to form further exemplary embodiments. Variations or modifications described with respect to one of the exemplary embodiments are also applicable to other exemplary embodiments.

In the exemplary embodiments illustrated and discussed, direct electrical connections between components, i.e. connections without additional intervening elements (for example simple metal tracks or wires), can be replaced by indirect connections, i.e. connections with one or more additional intervening elements, and vice versa, as long as the basic function of the connection, for example transmission of a signal, transmission of information or implementation of control, is substantially maintained. In other words, electrical connections illustrated can be modified as long as the basic function of the respective connection remains substantially unchanged.

Exemplary embodiments discussed here relate to devices for generating a bias voltage for transceivers, corresponding transceivers and corresponding methods.

In this case, a transceiver is a communication device which can both transmit and receive signals. Transceivers of this type can be wireless transceivers, such as are used in cellular phones, for example, or else wired transceivers. In this case, the transceivers used in embodiments are in particular transceivers which operate according to a time division multiplexing method (TDD, abbreviation of "time division duplexing"). In the case of time division multiplexing methods of this type, signals are transmitted and received alternately, that is to say that the transceiver is either in transmission operation or in reception operation, but not both at the same time. In exemplary embodiments, a guard interval between transmission and reception and/or between reception and transmission of signals in such time division multiplexing operation is used to control a bias voltage for the transceiver. Guard intervals of this type are usually provided in order to reliably avoid an overlap between transmission and reception of signals in time division multiplexing operation. In this way, in various exemplary embodiments, it is possible to achieve control of the bias voltage in the course of operation. In this regard, in some embodiments, alterations of system parameters such as alterations caused by temperature or by drift can be continuously compensated for.

FIG. 1 shows a block diagram of a transceiver 10 in accordance with one exemplary embodiment. The transceiver 10 comprises a transmitting circuit 13 and a receiving circuit 14. The transmitting circuit 13 and the receiving circuit 14 can comprise conventional components of such transmitting or receiving circuits such as amplifiers or filters. In particular, the transmitting circuit 13 can comprise a power amplifier that receives a bias voltage, for example in order to bias a control terminal of a transistor of the power amplifier. In the case of a field effect transistor (FET) or an insulated gate bipolar transistor (IGBT), the control terminal corresponds to the gate terminal; in the case of a bipolar transistor, the control terminal corresponds to a base terminal. Examples thereof will also be explained later. Other components of the transceiver 10 can also receive a bias voltage.

The transmitting circuit 13 receives a signal TX_in to be transmitted, which can represent data to be transmitted, for example, filters and/or amplifies said signal and outputs it via a separating component 11 (circulator) to an antenna 12. The receiving circuit 14 receives a signal from the antenna 12 via the separating component 11 and processes the received signal and outputs a corresponding reception signal $RX_{out}$. A timing controller 15 activates and deactivates the transmitting circuit 13 and the receiving circuit 14 by means of signals $TX_{enable}$, $RX_{enable}$ as illustrated, in order to ensure operation in the time division multiplexing method. For this purpose, the timing controller 15 can receive a selection signal $RX/TX_{selection}$, which defines for example a length of transmission and reception intervals. Between times when the transmitting circuit 13 is active (called transmission periods or transmission intervals) and times when the receiving circuit 14 is activated (called reception periods or reception intervals), a guard interval is inserted by the timing controller 15 in the exemplary embodiment in FIG. 1. The transceiver in FIG. 1 is then configured to control a bias voltage for the transceiver during these guard intervals or a portion of these guard intervals in order thus to be able to compensate for changes in system parameters. Examples of techniques which can be used for this purpose will be explained in greater detail later.

Apart from controlling a bias voltage in the guard intervals, the transceiver 10 in FIG. 1 can be configured in any conventional manner.

Figure 2:
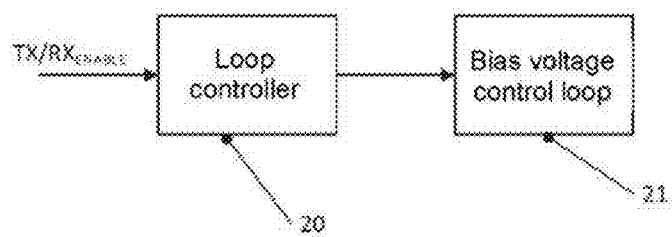
FIG. 2 is a block diagram of a device for generating a bias voltage in accordance with one exemplary embodiment.

FIG. 2 shows a schematic block diagram illustrating such control of the bias voltage during guard intervals. In this case, the bias voltage is controlled to a desired value by means of a bias voltage control loop 21.

The bias voltage control loop 21 is activated and deactivated by a loop controller 20. The loop controller 20 receives for example the signals $TX_{enable}$ and $RX_{enable}$ from the timing controller 15 in FIG. 1 and activates the bias voltage control loop 21 in guard intervals if a transmitting circuit such as the transmitting circuit 13 is not activated by the signal $TX_{enable}$ nor is a receiving circuit such as the receiving circuit 14 activated by the signal $RX_{enable}$. It should be noted that, in other exemplary embodiments, the loop controller 20 can also be directly integrated into the timing controller 15 in FIG. 1. In still other exemplary embodiments, the loop controller 20 can obtain from a timing controller a separate signal indicating a guard interval. It should further be noted that the loop controller 20 in some exemplary embodiments, as will be explained in even greater detail later, can activate the bias voltage control loop 21 in a delayed manner after the beginning of the guard interval, in order for example to wait until a transient recovery time for the bias voltage has elapsed.

Figure 3:
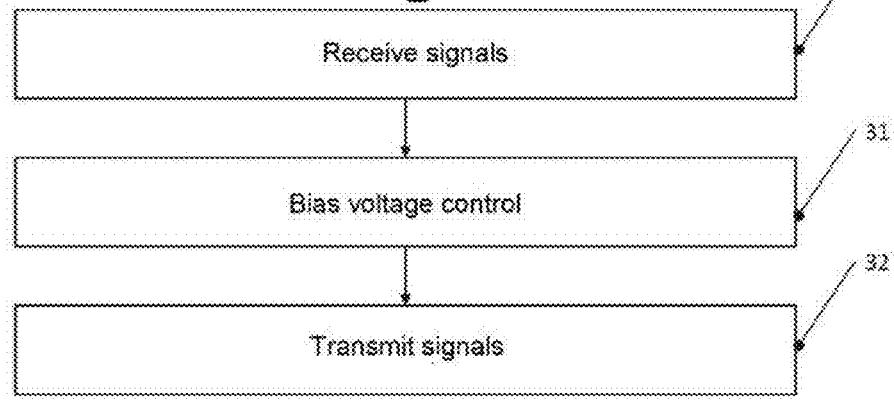
FIG. 3 is a flow diagram for illustrating a method in accordance with one exemplary embodiment.

FIG. 3 shows a flow diagram of a method in accordance with one exemplary embodiment, which can be implemented for example in the devices in FIGS. 1 and 2, but is not restricted hereto. At 30 in FIG. 3, signals are received in a time division multiplexing method. After the signals have been received, a guard interval follows, during which bias voltage control is carried out at 31 in FIG. 3. This is followed by signals being transmitted at 32. It should be noted that 30 and 32 in FIG. 3 can additionally and/or alternatively also be interchanged, that is to say that, in other exemplary embodiments, bias voltage control can additionally or alternatively also take place after transmission of signals and before reception of signals. Moreover, the bias voltage control can take place during each guard interval between reception of signals and transmission of signals and/or between transmission of signals and reception of signals, but can also take place only in some guard intervals, for example in every m-th guard interval or at specific time intervals. As already mentioned with reference to FIG. 2, the bias voltage control at 31 can additionally start in a delayed manner after the beginning of the guard interval.

Figure 4:
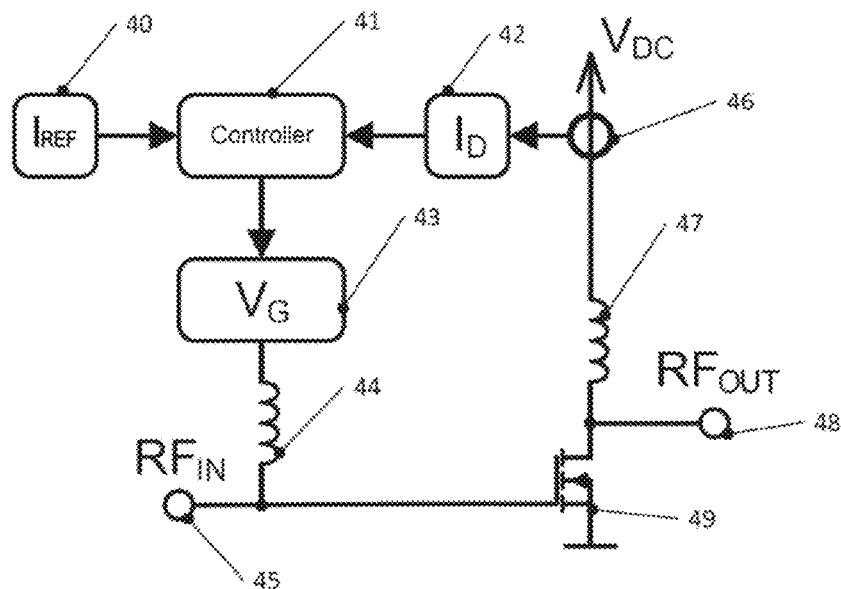
FIG. 4 is a diagram of a control loop which can serve as a basis for control loops used in some exemplary embodiments.

FIG. 4 shows a control loop circuit for a power amplifier, which represents one example of a bias voltage control loop such as the control loop 21 in FIG. 2. The control loop circuit in FIG. 4 additionally serves as a basis for exemplary embodiments discussed later with reference to FIGS. 5-10 and 12. Elements in FIGS. 5-10 and 12 which correspond to components in FIG. 4 bear the same reference signs and will not be explained again.

In the exemplary embodiment in FIG. 4, a power transistor 49, in this case a power MOSFET, serves as a power amplifier in a transmitting circuit, for example the transmitting circuit 13 in FIG. 1. A gate terminal of the transistor 49 is connected to a radio-frequency input 45, at which a radio-frequency signal $RF_{in}$ (for example the signal $TX_{in}$ in FIG. 1 or a signal derived therefrom) is to be applied. A source terminal of the transistor 49 is connected to ground. A drain terminal of the transistor 49 is connected to an output terminal 48, which outputs an amplified radio-frequency signal $RF_{out}$, for example for outputting to the antenna 12 in FIG. 1 or for outputting to further components such as further amplifiers or filters. The output terminal 48 and the drain terminal of the transistor 49 are furthermore connected to a DC supply voltage $V_{DC}$ via an inductance 47, as illustrated in FIG. 4.

Furthermore, the gate terminal of the transistor 49 is connected to a controllable bias voltage $V_G$ via an inductance 44. The bias voltage $V_G$ defines an operating point of the transistor 49. In particular, said operating point in some exemplary embodiments is defined such that the output signal $RF_{out}$ behaves linearly with respect to the input signal $RF_{in}$. The input signal $RF_{in}$ modulates as it were the gate voltage at the gate terminal of the transistor 49, which causes a change in the conductivity of the channel of the transistor 49 and thus a corresponding change in the output signal $RF_{out}$.

In the case of the embodiment in FIG. 4, the control is carried out in particular such that a drain current $I_D$ of the transistor 49 in a state in which no signal $RF_{in}$ but rather only the bias voltage $V_G$ is present at the gate terminal of the transistor 49 is controlled on the basis of a reference current $I_{REF}$. The reference current $I_{REF}$ can be generated in any conventional way, for example by means of bandgap circuits, or can be provided as a digital value in the case of a digital implementation of the controller. In the case of the control loop circuit in FIG. 4, the current $I_D$ is measured by a current measuring device 46, as symbolized by reference sign 42, and is passed to a controller 41. In addition, the reference current $I_{REF}$, as symbolized by the reference sign 40, is also fed to the controller 41. The controller 41 then controls the settable bias voltage 43 on the basis of the reference current $I_{REF}$ and the measured drain current $I_D$, for example on the basis of a difference between $I_{REF}$ and $I_D$. The controller 41 can be configured in various ways, for example by means of counters, as a PID (proportional-integral-derivative) controller, as a PI controller, as a P controller or any other type of suitable controllers.

In this way the bias voltage $V_G$ is set, such that the drain current $I_D$ is equal to the reference current $I_{REF}$. It should be noted that the control loop arrangement in FIG. 4 need not necessarily control the current $I_D$ to the reference current $I_{REF}$ but rather can also control it to a current derived from the reference current $I_{REF}$, for example a multiple or a portion of the current IRE. This control is carried out, as explained above, during guard intervals in which the signal $RF_{in}$ is 0, i.e. outside in particular transmission of data. Therefore, in this case, only the bias voltage $V_G$ is present at the gate terminal of the transistor 49, and the drain current $I_D$ can be controlled to the value $I_{REF}$ without fluctuations occurring on account of the signal $RF_{in}$.

It should be noted that during reception of data, the transistor 49 is usually completely switched off (for example by a gate voltage of the transistor 49 being set to a value such that the transistor 49 is turned off), in order to avoid disturbances of reception of data on the basis of a remaining signal $RF_{out}$.

Figure 5:
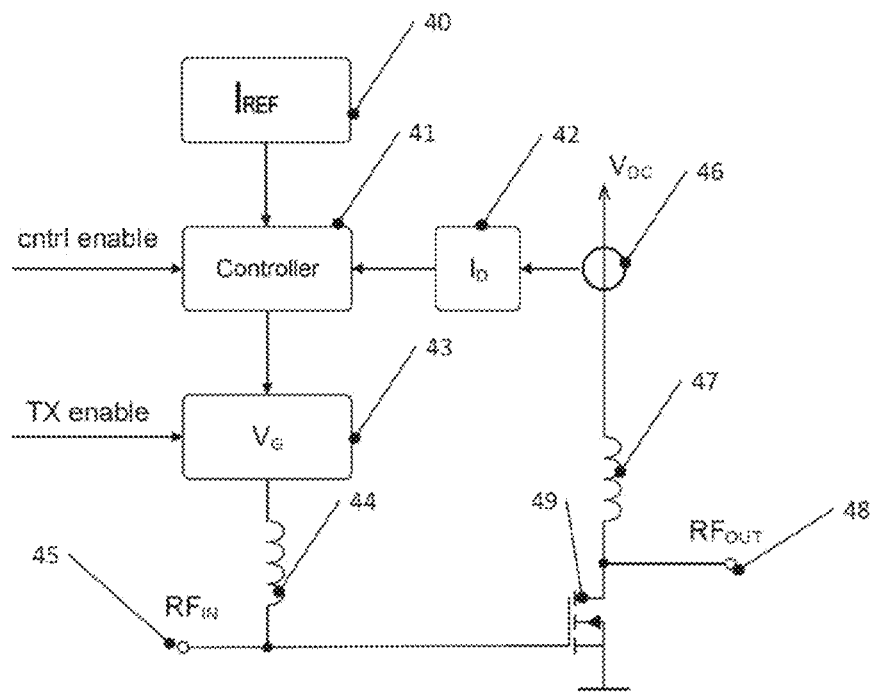
FIG. 5 is a diagram of a device in accordance with one exemplary embodiment.

FIG. 5 shows on the basis of the control loop in FIG. 4, an exemplary embodiment which in turn shows an example of a power amplifier having the transistor 49 and a corresponding control loop. In this case, the controller 41 is activated and deactivated by a signal $cntrl_{enable}$. In particular, the controller 41 is activated during all or some guard intervals or portions thereof (for example in a delayed manner only in a portion of a guard interval), such that control of the bias voltage takes place only during the guard intervals. Moreover, the controllable bias voltage 43 is activated depending on the signal $TX_{enable}$, such that the bias voltage is activated only during transmission and during the guard intervals preceding transmission, and the transistor 49 is otherwise switched off.

Figure 6:
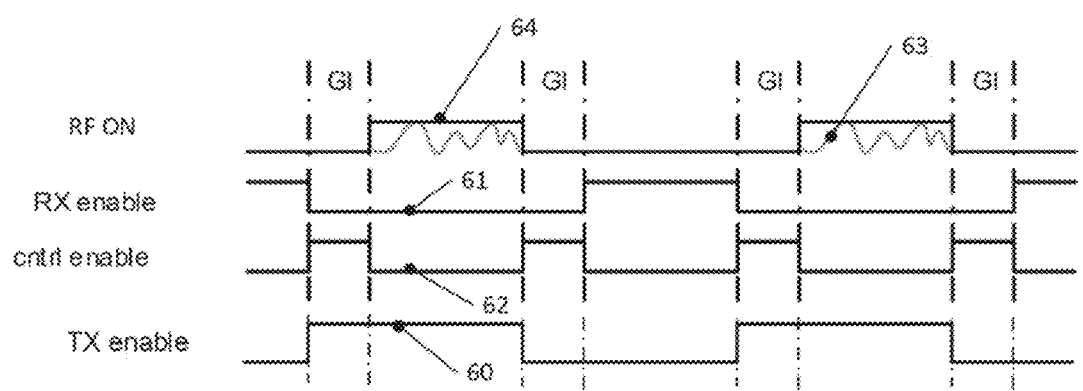
FIG. 6 shows schematic examples of signals in the exemplary embodiment from FIG. 5.

For illustration purposes, FIG. 6 shows schematic examples of signals in the exemplary embodiment in FIG. 5. It should be noted that the signals in FIG. 6 and other signal waveforms which are illustrated and explained in the present application serve merely for illustration and should not be interpreted as restrictive. In particular, the exact form of signals may depend on the respective specific implementation of a circuit.

FIG. 6 shows a signal $TX_{enable}$ 60, which indicates when the bias voltage is activated and the circuit is thus ready for transmitting signals, a signal $RX_{enable}$ 61, which indicates when reception of signals is activated, and a signal $cntrl_{enable}$ 62, which indicates when control of a bias voltage as explained in FIG. 5 is active. A signal RF ON 64 indicates the time periods during which a radio-frequency signal is actually transmitted, that is to say the transmission intervals. As can be seen, in guard intervals GI neither transmission nor reception of signals is activated, and during this time the signal $cntrl_{enable}$ 62 activates the control of the bias voltage. 63 schematically indicates a signal $RF_{in}$ at the input 45, which signal is present in the transmission intervals defined by the signal RF ON. As already explained, this signal modulates the bias voltage fed to the gate terminal of the transistor 49 during transmission operation such that here the drain current $I_D$ likewise changes correspondingly. On the other hand, during reception of data, the bias voltage $V_G$ is switched off or set to a value that switches off the transistor 49, such that here no drain current (apart from, possibly, undesired leakage current) flows. During the guard intervals GI, by contrast, the bias voltage $V_G$ can be switched on and is not influenced by the signal $RF_{in}$, such that control of the bias voltage $V_G$, in order to bring the drain current $I_D$ to the current $I_{REF}$ or a value derived therefrom, is possible here.

In some embodiments, already during the guard interval GI the signal $TX_{enable}$ can also assume a value that activates the bias voltage $V_G$ while the signal $RF_{in}$ becomes active only after the guard interval has elapsed.

As already mentioned, after the bias voltage has been activated, the duration of a reception period may elapse before the bias voltage and the drain current $I_D$ have reached a steady-state value. Therefore, in order to take account of this effect, in some embodiments, control of the bias voltage can be carried out in a delayed manner. A corresponding exemplary embodiment will now be explained with reference to FIG. 7.

Figure 7:
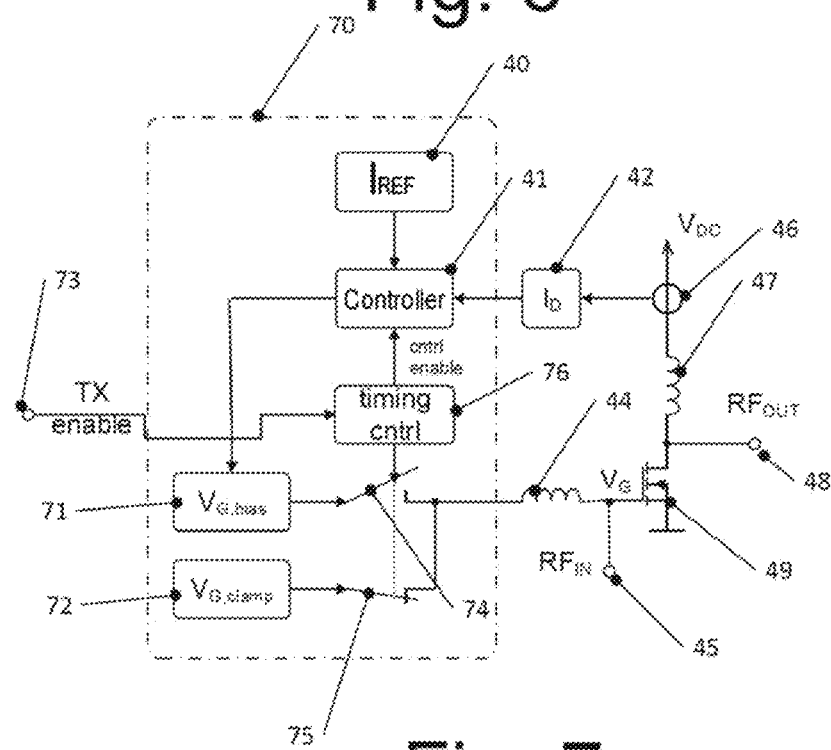
FIG. 7 is a diagram of a device in accordance with a further exemplary embodiment.

The exemplary embodiment in FIG. 7 comprises a bias voltage generating device 70. In FIG. 7, the signal $TX_{enable}$ is fed to a timing controller 76. In this case, both during the guard interval and during actual transmission, the signal $TX_{enable}$ has a value that indicates activation of the bias voltage. Data are then actually transmitted only during the transmission period.

If the signal $TX_{enable}$ indicates an activation of the bias voltage (for example is at a logic high level), the timing controller 76 closes a switch 74 and opens a switch 75. As a result, a controllable bias voltage generation unit 71 is connected to the gate of the transistor 49 via the inductance 44. In this case, the controllable bias voltage unit 71 corresponds to the controllable bias voltage unit 43 in FIG. 4, that is to say that it generates a bias voltage in order to define an operating point of the transistor 49. If the signal $TX_{enable}$ does not indicate an active state (which, in some exemplary embodiments, is tantamount to a signal $RX_{enable}$ indicating a reception state), the timing controller 76 closes the switch 75 and opens the switch 74. As a result, a voltage $V_{G,clamp}$ that is below a transistor threshold of the transistor 49 is connected to the gate of the transistor 49 and thus puts the transistor 49 into an off state. In the case of gallium nitride (GaN)-based HEMTs (high electron mobility transistor) the voltage $V_G$, clamp can be for example at −5 V or some other value which is negative with respect to ground, but is not restricted thereto and can be chosen in particular depending on the implementation of the transistor 49 such that the transistor 49 is turned off upon the voltage $V_{G,clamp}$ being applied to its gate.

Furthermore the timing controller 76 generates a signal $cntrl_{enable}$ for activating the controller 41 and thus the control loop that controls the drain current $I_D$ to a value dependent on a reference current $I_{REF}$. The controller 41 then controls the bias voltage $V_{G,bias}$ as described above.

In this case, the timing controller 76 generates the signal $cntrl_{enable}$ with a delay with respect to an active state of the signal $TX_{enable}$ (i.e. a state which causes the timing controller 76 to close the switch 74 and to open the switch 75), generated in a delayed manner. This can have the effect that the control starts only when the voltage $V_{G,bias}$ and the drain current $I_D$ have assumed a steady-state value after the closing of the switch 74.

This will now be illustrated with reference to FIG. 8, which shows schematic examples of signals in the exemplary embodiment from FIG. 7 against time.

Figure 8:
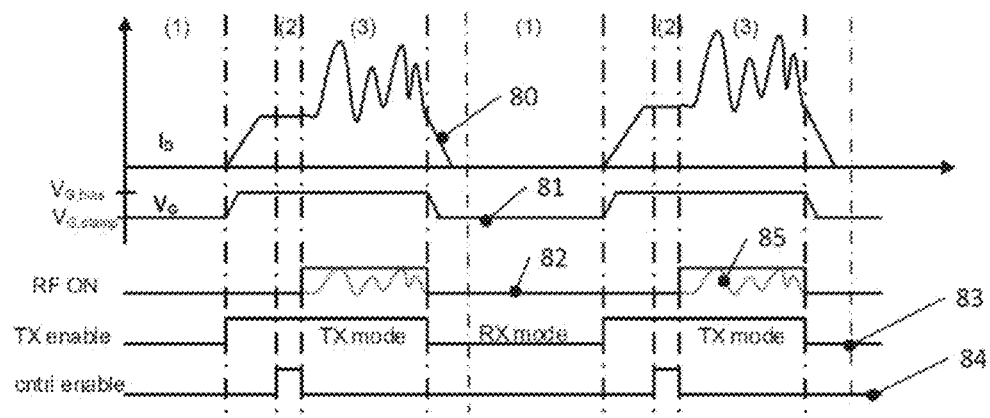
FIG. 8 shows examples of signals in the device from FIG. 7.

In FIG. 8, a curve 80 shows the drain current $I_D$, a curve 81 shows the voltage $V_G$ at the gate of the transistor 49 (determined by $V_{G,bias}$ or $V_{G,clamp}$ depending on the position of the switches 74, 75), a curve 83 shows the signal $TX_{enable}$ and a curve 84 shows the signal $cntrl_{enable}$. A curve 82 shows a signal $RF_{on}$, which indicates when transmission operation actually takes place i.e. a signal $RF_{in}$ is applied to the input 45. Curves 85 indicate the signal $RF_{in}$, which is superposed on the gate voltage of the transistor 49 in transmission operation.

In a phase (1) in FIG. 8, the device is in reception operation. Upon the signal $TX_{enable}$ rising to an active level, the guard interval begins. At the beginning of the guard interval, upon the rising of the signal $TX_{enable}$ (curve 83), the switch 74 is closed, and the switch 75 is opened. Therefore, the data voltage $V_G$ at the gate of the transistor 49 rises from the value $V_{G,clamp}$ to the value $V_{G,bias}$ as illustrated in curve 81. In a manner corresponding to this rise in the gate voltage, the drain current $I_D$ also rises from 0 to a steady-state value.

If $V_G$ and $I_D$ have reached steady-state values, the control of the bias voltage, i.e. the controller 41, is activated in a phase (2) by the signal $cntrl_{enable}$ in a manner corresponding to the curve 84. Here the gate voltage is then controlled such that the drain current $I_D$ assumes a value predefined by the reference current $I_{REF}$. After phase (2), in phase (3) there then follows the actual transmission of a signal, with a drain current correspondingly modulated by the input signal $RF_{in}$. At the end of phase (3) a guard interval takes place, in which, after the switch 75 has been closed and the switch 74 has been opened, the gate voltage $V_G$ falls to $V_{G,clamp}$ and the drain current $I_D$ correspondingly falls to 0. Reception of signals then follows again in phase (1). In the case of the embodiment in FIG. 8, therefore, the bias voltage is controlled only in the guard interval in the transition from reception to transmission, but not in the guard interval between transmission and reception. In other embodiments, it is possible in this interval, too, to control the bias voltage or else some other bias voltage in the transceiver.

Figure 9:
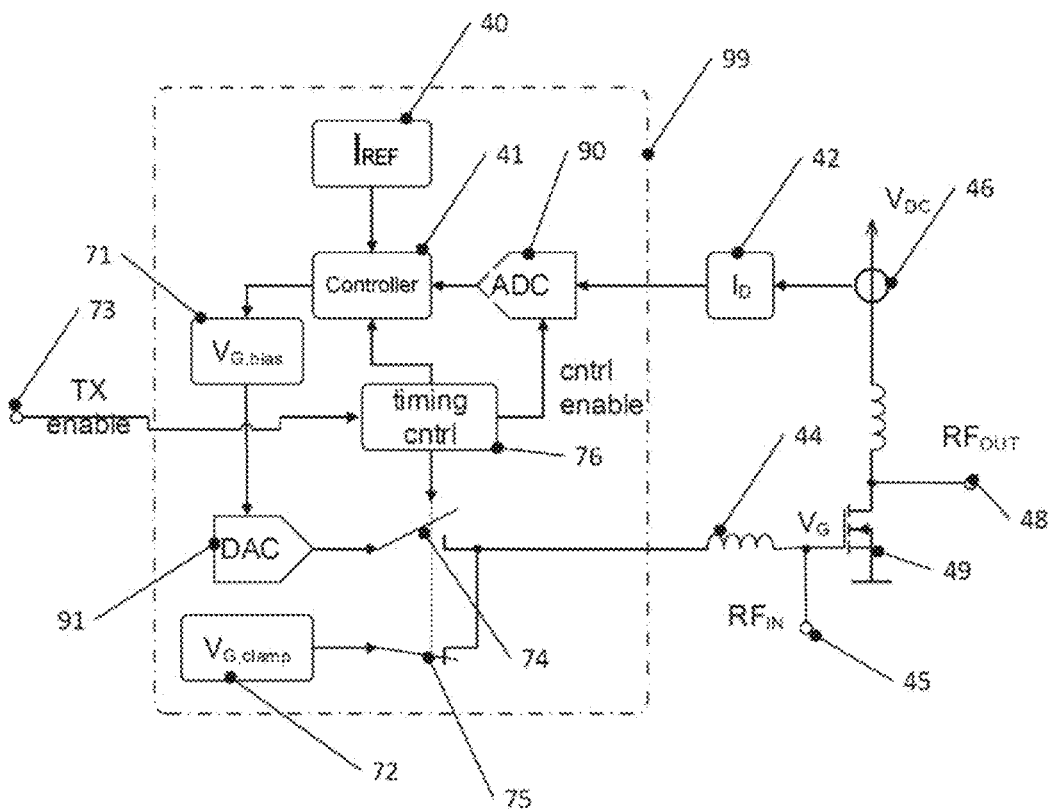
FIGS. 9 and 10 are diagrams showing devices in accordance with further exemplary embodiments.
Figure 10:
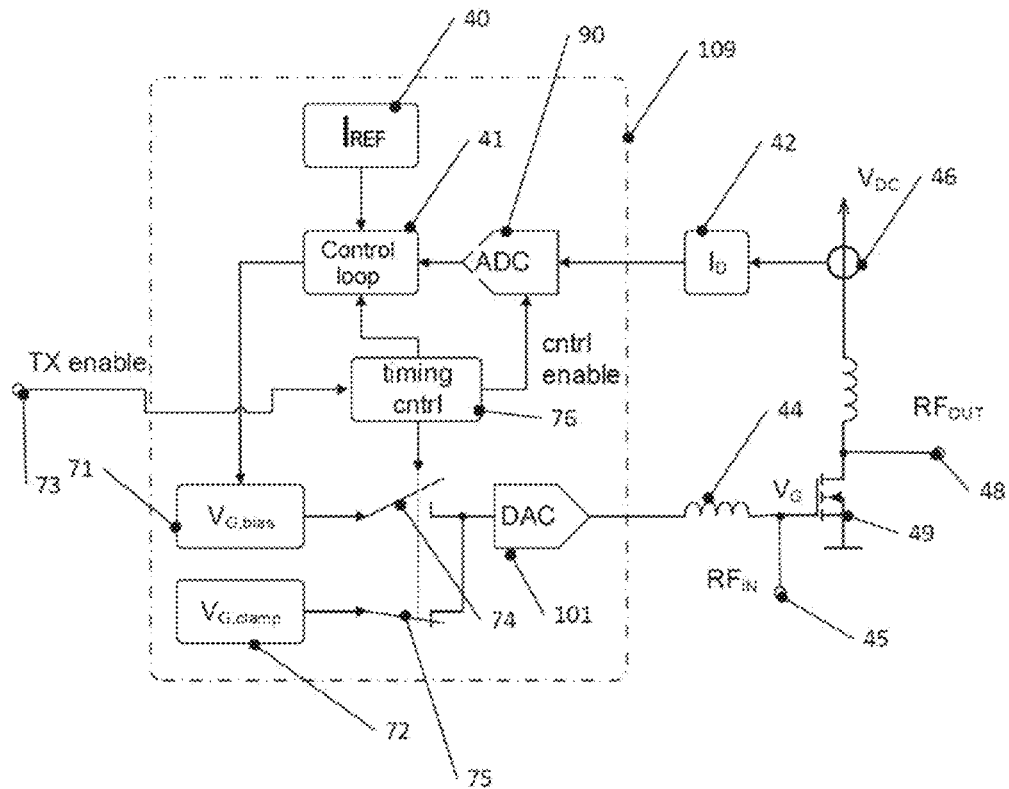

FIGS. 9 and 10 show more detailed possibilities for implementation of the exemplary embodiment in FIG. 7. Components that have already been explained with reference to FIG. 7 (or previously with reference to FIG. 4) bear the same reference signs and will not be explained again.

In the case of the exemplary embodiment in FIG. 9, the measured drain current $I_D$ corresponding to the reference sign 42 is converted into a digital value by an analog-to-digital converter (ADC) 90, said digital value being fed to the controller 41. Both the analog-to-digital converter 90 and the controller 41 are activated by the timing controller 76 during the guard interval (for example in a manner corresponding to the signal $cntrl_{enable}$ of the curve 84 in FIG. 8), such that both the analog-to-digital converter 90 and the controller 41 are activated only during the corresponding part of the guard interval. The control loop can then be clocked with the values provided by the analog-to-digital converter. In this case, the reference current $I_{REF}$ is likewise present at a digital value. By way of example, an actual reference current can be digitized for the purpose of providing the digital value. The controller 41 then sets a digital value 71 for the bias voltage $V_{G,bias}$. Said digital value is transformed into a corresponding analog voltage value by a digital-to-analog converter 91.

The exemplary embodiment in FIG. 9 therefore involves changing between a voltage value corresponding to $V_{G,bias}$ that is output by the digital-to-analog converter 91 and a value for the voltage $V_{G,clamp}$ that is output by a voltage source 72 by means of the switches 74, 75.

One variant thereof is shown in FIG. 10. In the case of the exemplary embodiment in FIG. 10, once again the drain current $I_D$ is digitized by means of the analog-to-digital converter 90 and fed to the controller 41, which sets a digital value 71 for the voltage $V_{G,bias}$. In contrast to FIG. 9, the voltage $V_{G,clamp}$ at the reference sign 72 is also present as a digital value in FIG. 10. A digital-to-analog converter 101 is provided in order depending on the position of the switches 74, 75 to convert the digital value for $V_{G,bias}$ or the digital value for $V_{G,clamp}$ into an analog voltage and to feed it to the transistor 49 as gate voltage $V_G$. In this case, the switches 74, 75 can be implemented by means of a corresponding digital logic which feeds for example either the content of a first register, containing the value $V_{G,bias}$, or of a second register, containing the value $V_{G,clamp}$, to the digital-to-analog converter 101. In other words, the switches 74 and 75 do not have to be implemented as discrete switches (for example transistor switches), rather it is also possible to use other components that fulfill the function of the switches 74, 75.

Figure 11:
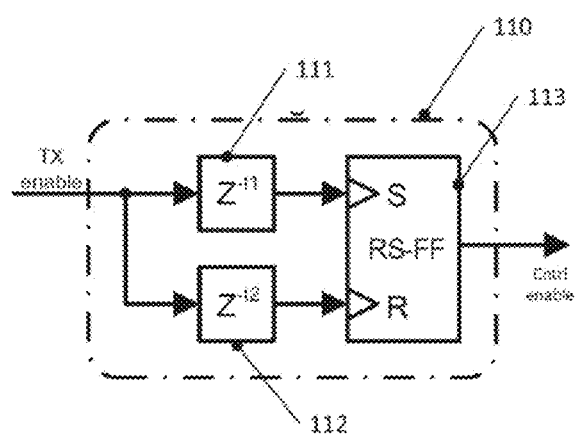
FIG. 11 is a diagram of a controller in accordance with one exemplary embodiment.

FIG. 11 shows one example of a timing controller 110 in accordance with one exemplary embodiment, which is usable as timing controller 76. The timing controller 110 in FIG. 11 receives the signal $TX_{enable}$, which, as illustrated in FIG. 8, indicates a time at which the bias voltage $V_{G,bias}$ is active, including a guard interval upon transition from reception to transmission of signals and the transmission period. The signal $TX_{enable}$ is fed to a first delay element 111 and to a second delay element 112. The first delay element 111 delays the signal $TX_{enable}$ by a time t1, and the second delay element 112 delays the signal $Tx_{enable}$ by a time t2.

The time t1 indicates a delay between the signal $TX_{enable}$ and the beginning of the signal $cntrl_{enable}$ (in FIG. 8 a time between the rising edge of the signal $TX_{enable}$ and the rising edge of the signal $cntrl_{enable}$), and the time t2 indicates a delay time between the signal $TX_{enable}$ and the end of the signal $cntrl_{enable}$ (in FIG. 8 a time between the rising edge of the signal $TX_{enable}$ and a falling edge of the signal $cntrl_{enable}$).

In this case, the time t2 is chosen such that the signal $cntrl_{enable}$ ends before the beginning of the transmission of signals (before the time period (3) in FIG. 8).

The output of the delay element 111 is connected to a set input of a reset-set flip-flop (RS-FF), and an output of the delay element 112 is connected to a reset input of the reset-set flip-flop 113. As a result, the corresponding signal $cntrl_{enable}$ is output at an output of the reset-set flip-flop 113, which signal, as shown in curve 84 in FIG. 8, correspondingly activates the controller 41 and, if present, the analog-to-digital converter 90.

Figure 12:
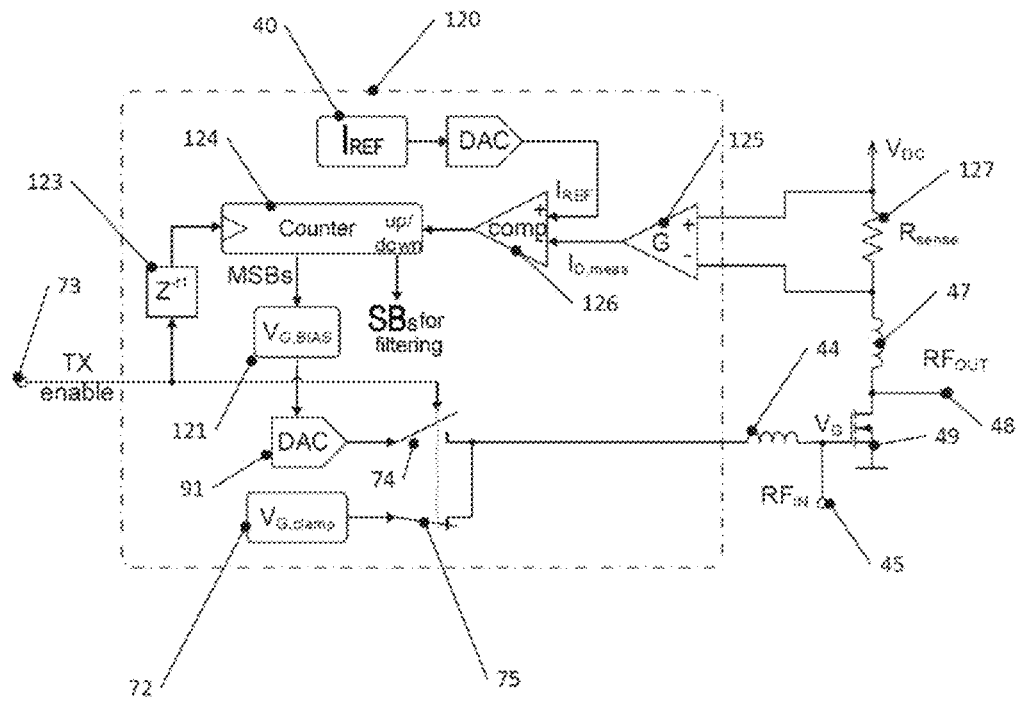
FIG. 12 is a diagram showing a device in accordance with one exemplary embodiment.

FIG. 12 shows a circuit diagram of part of a transceiver, in particular of a power amplifier, in accordance with a further exemplary embodiment. In particular, examples of implementation details are given in the exemplary embodiment in FIG. 12. Elements that have already been described above bear the same reference signs and will not be explained again.

The exemplary embodiment in FIG. 12 comprises a bias voltage generating device 120.

In the case of the exemplary embodiment in FIG. 12, the drain current $I_D$ of the transistor 49 is measured by means of a measuring resistor 127 connected in series with the inductance 47. In this case, in exemplary embodiments, the measuring resistor 127 has a low resistance in order to limit losses as a result of the current measurement. By way of example, the resistance value $R_{sense}$ of the measuring resistor 127 can be less than 5Ω, for example less than 1 n. Terminals of the measuring resistor 127 are connected to inputs of a differential amplifier 125 having a gain factor G. An output of the amplifier 125 represents a measure of the drain current $I_D$. The output is fed to a negative input of a comparator 126.

In addition, the reference current $I_{ref}$ is provided to a positive input of the comparator 126 by means of a digital-to-analog converter 123. Here, therefore, an actual reference current is generated and digitized. In other exemplary embodiments, it is also possible directly to provide a digital value, for example in a register, as reference current value. The output of the comparator 126 then indicates whether the reference current $I_{REF}$ is greater or less than the drain current $I_D$.

The output of the comparator 126 is connected to a counter 124. The counter 124 is clocked with the signal $TX_{enable}$ in a manner delayed by the time t1 by a delay element 123. As in FIG. 11, the time t1 is a delay after an active signal level of the signal $TX_{enable}$ has been assumed, for example after the rising edge in FIG. 8.

In this configuration, the counter 124 in each transmission/reception cycle, in particular in each guard interval, upon transition from reception of signals to transmission of signals, increments by 1 if the reference current $I_{ref}$ is greater than the measured drain current $I_D$, and decrements by 1 if this is not the case. The most significant bits (MSBs) are used for defining a digital value 121 for $V_G$,bias. By way of example, a bit value formed directly by the most significant bits can correspond to the value $V_G$,bias, or a conversion, for example a scaling, can also be performed. By contrast, the least significant bits (LSBs) are discarded. The number of bits discarded can depend on the implementation and can be 1 or 2, for example. A filtering is brought about by this discarding of the least significant bits.

This filtering has the effect, in particular, that the voltage $V_G$,bias does not already change in the case of very small fluctuations of the drain current $I_D$, for example in the case of fluctuations that would alternately bring about incrementing and decrementing of the counter 124, but rather only if a trend in the change of $I_D$ is present to the effect that the counter 124 counts principally upward or principally downward over a plurality of measurement cycles, i.e. a plurality of transmission/reception cycles. Consequently, as a result of the filtering, a change in the voltage $V_{G,bias}$ arises only after $2^n$ counting events in the same direction net (i.e. counting events in this direction minus counting events in the other direction) over a time period, wherein n is the number of least significant bits that are discarded for the purpose of filtering. In other exemplary embodiments, however, a filtering of this type can also be omitted or realized by means of other implementations.

The digital value $V_{G,bias}$ thus set at 121 is then converted into an analog value by the digital-to-analog converter 91 as explained with reference to FIG. 9. Instead of the digital-to-analog converter 91, a digital-to-analog converter downstream of the switch 74 such as the digital-to-analog converter 101 in FIG. 10 can also be provided.

The functioning of the devices discussed will now also be explained with reference to simulation results as illustrated in FIGS. 13A through 15B.

Figure 13A:
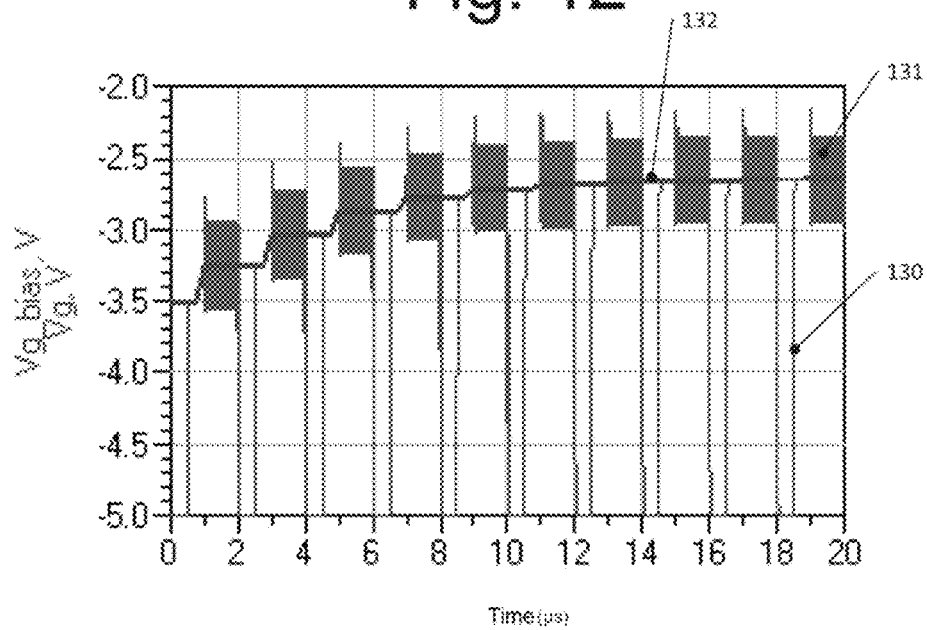
FIGS. 13A, 13B, 14A, 14B, 15A, and 15B show simulations for illustrating exemplary embodiments.

In FIG. 13A, a curve 130 shows a profile of the gate voltage of the transistor 49 over a multiplicity of transmission and reception cycles. Regions 131 of the curve 130 occur during transmission of signals in which the gate voltage is modulated by the radio-frequency signal $RF_{in}$. A curve 132 shows the profile of the bias voltage $V_{G,bias}$. In this simulation, the voltage $V_{G,clamp}$ is −5.0 V, i.e. in particular during the reception of signals the gate voltage in accordance with the curve 130 falls to −5.0 V.

Figure 13B:
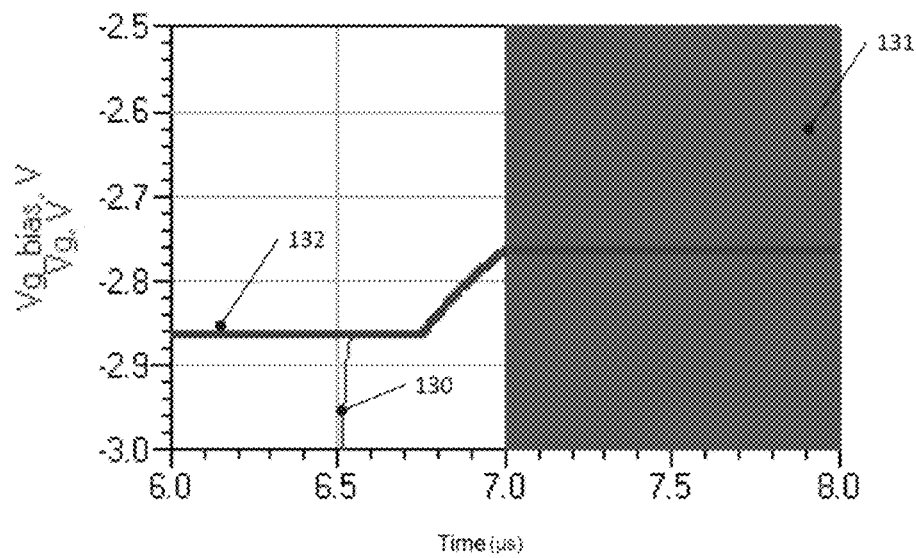

FIG. 13B shows an enlarged portion of FIG. 13A for one transmission-reception cycle.

Figure 14A:
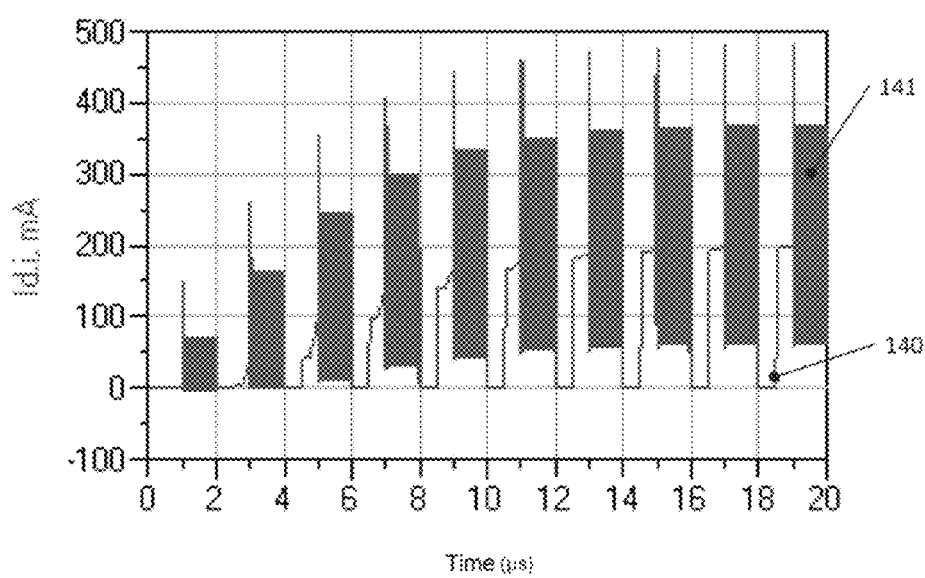

FIG. 14A, a curve 140 shows a corresponding profile of the drain current $I_D$. Regions 141 once again correspond to transmission of signals in which the drain current changes in a manner corresponding to the modulation of the gate voltage by the radio-frequency input signal $RF_n$.

Figure 14B:
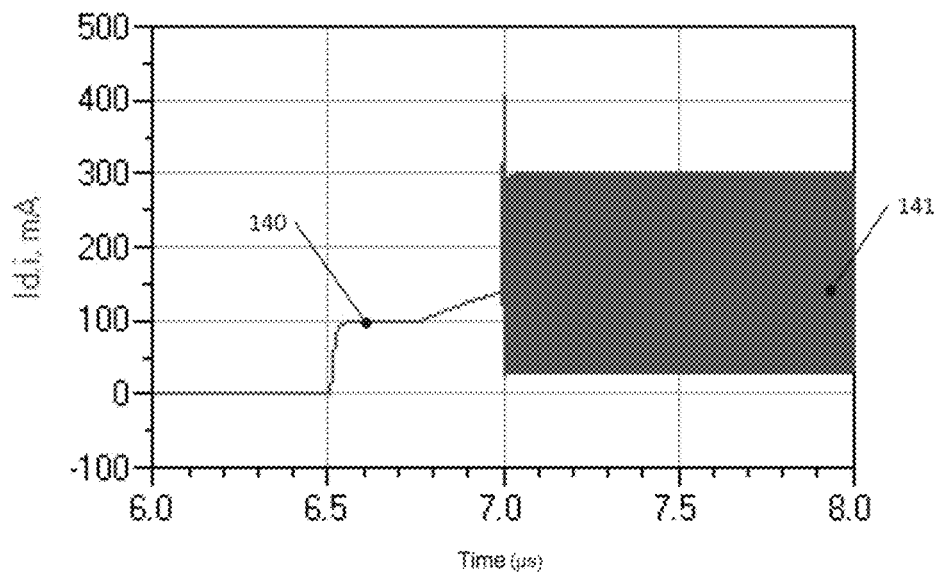

FIG. 14B shows an enlarged portion for a time segment corresponding to FIG. 13B of the profile of the drain current $I_D$.

Figure 15A:
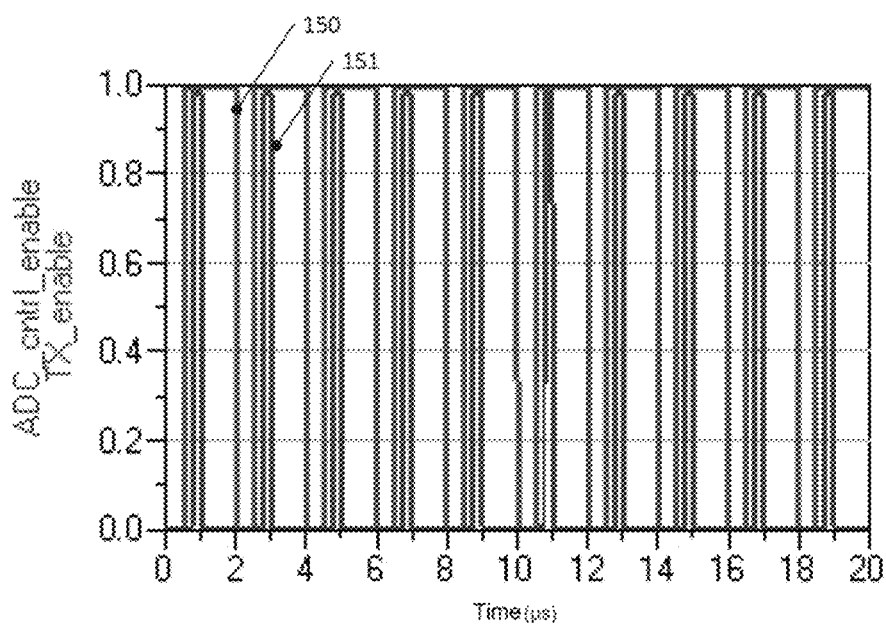
Figure 15B:
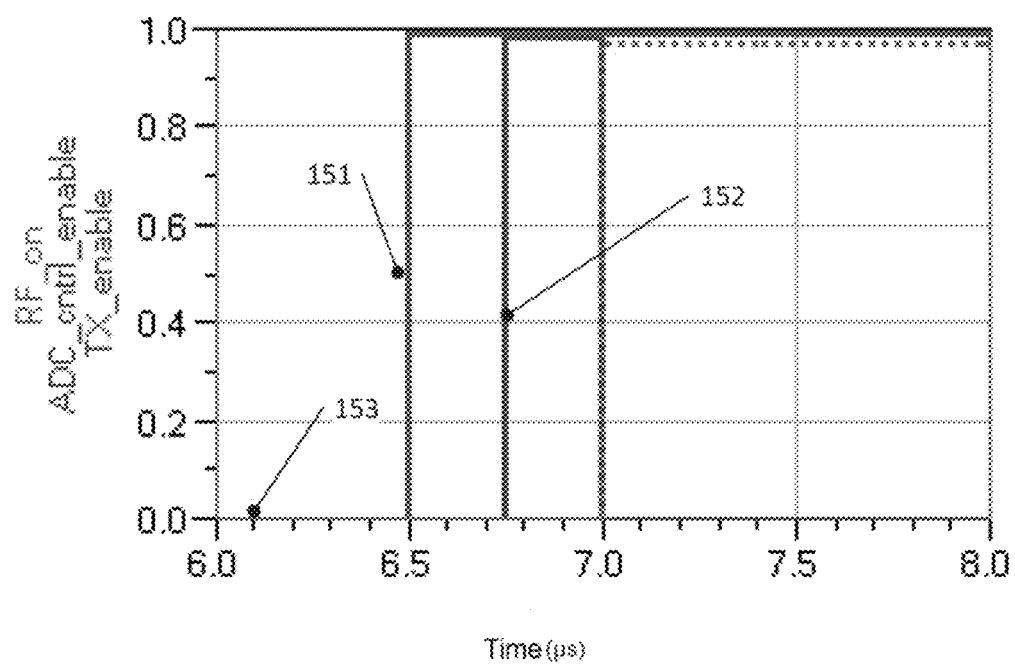

In FIG. 15A, a corresponding profile of the signal $TX_{enable}$ is shown in a curve 150 and a curve 151 shows the profile of the signal $CNTRL_{enable}$, with which the analog-to-digital converter 90 and the controller 41 are activated for example in FIG. 9. FIG. 15B in turn shows an enlarged portion of FIG. 15A.

In the example in FIGS. 13A through 15B $I_{ref}$ is 200 mA. As can be seen, the bias voltage $V_{G,bias}$ is controlled such that after a plurality of transmission/reception cycles, the drain current $I_D$ is controlled to the corresponding value of 200 mA in the state in which only the bias voltage $V_{G,bias}$, but no radio-frequency signal $RF_{in}$, is present, an adaptation step being carried out before each transmission of data.

The curves shown in FIGS. 13A through 15B serve merely for further illustration, and actual curves can deviate from these simulation curves depending on the implementation.

At least some exemplary embodiments are defined in the following examples:

Example 1

A device for generating a bias voltage for a transceiver operating in time division multiplexing operation, comprising: a bias voltage control loop for controlling the bias voltage; and a loop controller, configured to deactivate the bias voltage control loop during transmission and reception of signals by the transceiver and to activate said bias voltage control loop at least in a portion of at least some guard intervals between transmission and reception of signals of the transceiver.

Example 2

Device according to example 1, wherein the loop controller is configured to activate the bias voltage control loop in at least some guard intervals upon transition from reception of data to transmission of data.

Example 3

The device according to example 2, wherein the loop controller is configured to activate the bias voltage control loop in a delayed manner after the beginning of the at least some guard intervals.

Example 4

The device according to example 1, wherein the bias voltage is a control voltage for a transistor of the transceiver, and wherein the bias voltage control loop is configured to control the bias voltage on the basis of a load current of the transistor and a reference current.

Example 5

The device according to example 4, wherein the control voltage is a gate voltage and the load current is a drain current.

Example 6

The device according to example 5, wherein the loop controller is configured to activate the bias voltage outside reception of signals of the transceiver and to deactivate said bias voltage during reception of signals and, during reception of data, to output a clamping voltage as control voltage to the transistor, which voltage has the effect that the transistor is turned off.

Example 7

The device according to example 4, wherein the bias voltage control loop comprises an analog-to-digital converter in order to digitize the load current, a controller in order to set a digital value for the bias voltage, and a digital-to-analog converter in order to convert the digital value of the bias voltage into an analog bias voltage.

Example 8

The device according to example 1, wherein the bias voltage control loop comprises a counter, wherein an output of the counter determines the bias voltage.

Example 9

The device according to example 8, wherein the bias voltage is determined by most significant bits of the counter, wherein least significant bits of the counter are discarded.

Example 10

A transceiver, comprising: a transmitting circuit; a receiving circuit; and a device for generating a bias voltage according to example 1.

Example 11

The transceiver according to example 8, wherein the device for generating a bias voltage is configured according to example 4, wherein the transistor is a transistor of a power amplifier of the transmitting circuit.

Example 12

A method for generating a bias voltage for a transceiver operating in a time division duplexing method, comprising: activating a bias voltage control in at least one portion of some guard intervals between transmission and reception of signals by the transceiver; and deactivating the bias voltage control upon transmission and reception of signals; and controlling the bias voltage if the bias voltage control is activated.

Example 13

The method according to example 12, wherein activating the bias voltage control comprises activating a bias voltage control in guard intervals upon transition between reception of signals and transmission of signals with a time delay with respect to a beginning of the guard interval.

Example 14

The method according to example 13, further comprising activating the bias voltage at the beginning of the guard interval, wherein the time delay is chosen in such a way that the bias voltage has a steady-state value after the time delay.

Example 15

The method according to example 12, further comprising providing the bias voltage for a control input of a transistor.

Example 16

The method according to example 15, wherein controlling the bias voltage comprises controlling the bias voltage on the basis of a load current of the transistor.

Example 17

The method according to example 15, wherein controlling the bias voltage comprises incrementing or decrementing a counter depending on a comparison of the load current with a reference current, wherein the bias voltage is determined on the basis of a counter reading of the counter.

Example 18

The method according to example 17, further comprising discarding one or more least significant bits of the counter.

Example 19

The method according to example 16, further comprising activating the bias voltage in guard intervals and during transmission of signals of the transceiver, and disconnecting the bias voltage from the control input of the transistor and connecting the control input of the transistor to a clamping voltage that puts the transistor into an off state, during reception of signals.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for generating a bias voltage for a transceiver operating in time division multiplexing operation, the device comprising:
    a bias voltage control loop configured to control the bias voltage; and
    a loop controller configured to deactivate the bias voltage control loop during transmission and reception of signals by the transceiver and to activate the bias voltage control loop in a delayed manner after a beginning of at least some guard intervals upon transition from reception of data to transmission of data and/or upon transition from transmission of data to reception of data.

2. The device of claim 1, wherein the bias voltage is a control voltage for a transistor of the transceiver, and wherein the bias voltage control loop is configured to control the bias voltage based on a load current of the transistor and a reference current.

3. The device of claim 2, wherein the control voltage is a gate voltage and the load current is a drain current.

4. The device of claim 2, wherein the loop controller is configured to activate the bias voltage control loop outside reception of signals of the transceiver and to deactivate the bias voltage control loop during reception of signals and, during reception of data, to output a clamping voltage as the control voltage to the transistor and that puts the transistor into an off state.

5. The device of claim 2, wherein the bias voltage control loop comprises an analog-to-digital converter configured to digitize the load current, a controller configured to set a digital value for the bias voltage, and a digital-to-analog converter configured to convert the digital value of the bias voltage into an analog bias voltage.

6. The device of claim 1, wherein the bias voltage control loop comprises a counter, and wherein an output of the counter determines the bias voltage.

7. The device of claim 6, wherein the bias voltage is determined by most significant bits of the counter, and wherein least significant bits of the counter are discarded.

8. A transceiver, comprising:
    a transmitting circuit;
    a receiving circuit; and
    a device configured to generate a bias voltage for the transceiver operating in time division multiplexing operation, the device comprising:
    a bias voltage control loop configured to control the bias voltage; and
    a loop controller configured to deactivate the bias voltage control loop during transmission and reception of signals by the transceiver and to activate the bias voltage control loop in a delayed manner after a beginning of at least some guard intervals upon transition from reception of data to transmission of data and/or upon transition from transmission of data to reception of data.

9. The transceiver of claim 8, wherein the bias voltage is a control voltage for a transistor of a power amplifier of the transmitting circuit, and wherein the bias voltage control loop is configured to control the bias voltage based on a load current of the transistor and a reference current.

10. The transceiver of claim 8, wherein the bias voltage control loop comprises a counter, and wherein an output of the counter determines the bias voltage.

11. A method for generating a bias voltage for a transceiver operating in a time division duplexing method, the method comprising:
    activating a bias voltage control in guard intervals upon transition between reception of signals and transmission of signals and/or upon transition between transmission of signals and reception of signals, with a time delay with respect to a beginning of the guard intervals;
    deactivating the bias voltage control upon transmission and reception of signals; and
    controlling the bias voltage if the bias voltage control is activated.

12. The method of claim 11, further comprising activating the bias voltage at the beginning of the guard intervals, wherein the time delay is chosen in such a way that the bias voltage has a steady-state value after the time delay.

13. The method of claim 11, further comprising providing the bias voltage for a control input of a transistor.

14. The method of claim 13, wherein controlling the bias voltage comprises controlling the bias voltage based on a load current of the transistor.

15. The method of claim 14, wherein controlling the bias voltage comprises incrementing or decrementing a counter depending on a comparison of the load current with a reference current, wherein the bias voltage is determined based on a counter reading of the counter.

16. The method of claim 15, further comprising discarding one or more least significant bits of the counter.

17. The method of claim 14, further comprising:
    activating the bias voltage in guard intervals and during transmission of signals of the transceiver; and
    disconnecting the bias voltage from the control input of the transistor and connecting the control input of the transistor to a clamping voltage that puts the transistor into an off state, during reception of signals.

* * * * *